US012652997B2

(12) United States Patent
Altecor et al.

(10) Patent No.: US 12,652,997 B2
(45) Date of Patent: Jun. 9, 2026

(54) COIN-SLOT AND BALL-LOCK CERAMIC LIFT PIN HOLDERS

(71) Applicant: LAM RESEARCH CORPORATION, Fremont, CA (US)

(72) Inventors: Aleksey V. Altecor, Newberg, OR (US); Andrew H. Breninger, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 931 days.

(21) Appl. No.: 17/776,636

(22) PCT Filed: Oct. 28, 2020

(86) PCT No.: PCT/US2020/057625
§ 371 (c)(1),
(2) Date: May 13, 2022

(87) PCT Pub. No.: WO2021/101681
PCT Pub. Date: May 27, 2021

(65) Prior Publication Data
US 2022/0406645 A1 Dec. 22, 2022

Related U.S. Application Data

(60) Provisional application No. 62/939,252, filed on Nov. 22, 2019.

(51) Int. Cl.
*H10P 72/76* (2026.01)
*H01J 37/32* (2006.01)
*H10P 72/10* (2026.01)

(52) U.S. Cl.
CPC ...... *H10P 72/7612* (2026.01); *H10P 72/1912* (2026.01); *H10P 72/7616* (2026.01); *H10P 72/7624* (2026.01)

(58) Field of Classification Search
None
See application file for complete search history.

(56) References Cited

U.S. PATENT DOCUMENTS 7,296,534 B2 * 11/2007 Fink ................. H01J 37/32532
156/345.43
8,764,473 B2 * 7/2014 Komatsubara ..... H01R 13/6276
439/348

(Continued)

FOREIGN PATENT DOCUMENTS

CN 1759203 A 4/2006
JP 2000294620 A 10/2000

(Continued)

OTHER PUBLICATIONS

International Search Report and Written Opinion of the ISA issued in PCT/US2020/057625, mailed Feb. 17, 2021; ISA/KR.

(Continued)

*Primary Examiner* — Sylvia MacArthur

(57) ABSTRACT

A first lift pin holder assembly includes a base portion and a stem portion including a ball lock mechanism to hold a lift pin. A second lift pin holder assembly includes a base portion and a stem portion including a fork lock mechanism to hold a lift pin. A slotted ring with coin-slot type slots is arranged on abase of a substrate support assembly. A plurality of the first or second lift pin holder assemblies are retained in the slots using retainers that surround the base portions of the lift pin holder assemblies. Each slot includes an aperture in which a T-shaped retainer is inserted. The top portion of the T-shaped retainer prevents the retainer and the lift pin holder assembly from sliding out of the slot. The lift pin, the lift pin holder assemblies, the retainers, the T-shaped retainer, and the slotted ring are made of ceramic materials.

12 Claims, 14 Drawing Sheets

(56) References Cited

U.S. PATENT DOCUMENTS

| | | | |
|---|---|---|---|
| 2004/0250766 A1 | 12/2004 | Fink | |
| 2005/0180737 A1 | 8/2005 | Kurita et al. | |
| 2006/0016398 A1 | 1/2006 | Dubost et al. | |
| 2011/0014396 A1 | 1/2011 | Polyak | |
| 2015/0348809 A1 | 12/2015 | Iu et al. | |
| 2017/0133260 A1 | 5/2017 | Pohl et al. | |
| 2018/0090363 A1 | 3/2018 | Breninger et al. | |
| 2022/0406645 A1* | 12/2022 | Altecor | H01J 37/32733 |

FOREIGN PATENT DOCUMENTS

| | | | | |
|---|---|---|---|---|
| JP | 2002213444 A | | 7/2002 | |
| JP | 2008112801 A | | 5/2008 | |
| JP | 2009295751 A | * | 12/2009 | |
| JP | 2011228212 A | | 11/2011 | |
| KR | 1020070079151 A | | 8/2007 | |
| KR | 20120131281 A | | 12/2012 | |
| KR | 1020120131281 A | | 12/2012 | |
| KR | 20150120750 A | | 10/2015 | |
| KR | 20170137381 A | | 12/2017 | |
| TW | 200527577 A | | 8/2005 | |
| TW | 200624587 A | | 7/2006 | |

OTHER PUBLICATIONS

Office Action issued in Corresponding Taiwanese Patent App. No. 109140457 mailed Jul. 30, 2024.

Office Action issued in Corresponding Chinese Patent App. No. 2020800811876 dated Jan. 14, 2025.

Office Action issued in Corresponding Korean Patent App. No. 1020227021227 mailed Dec. 13, 2024.

Allowance isssued in corresponding Japanese App. No. 2022528209 mailed Apr. 16, 2025.

Allowance issued in corresponding Korean App No. 10-2022-7021227 dated Aug. 14, 2025.

* cited by examiner

Section Z-Z

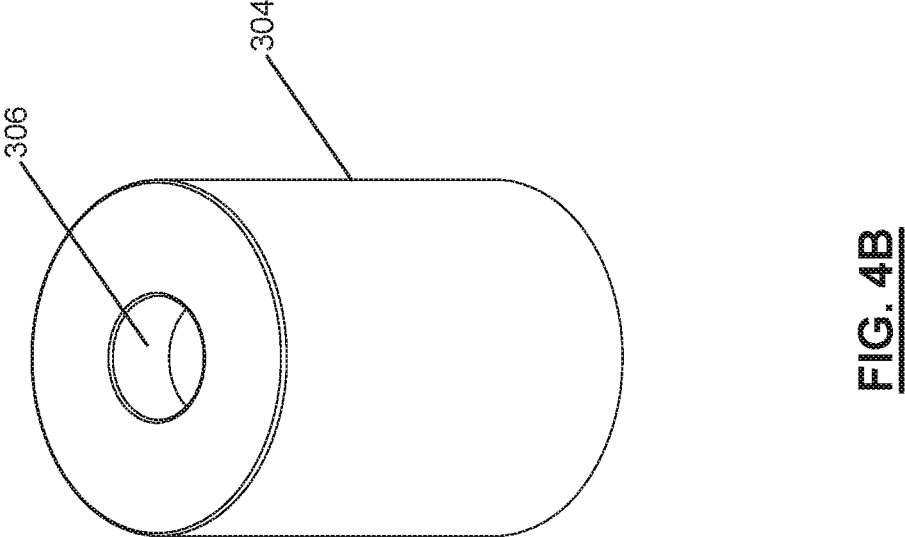
FIG. 4B
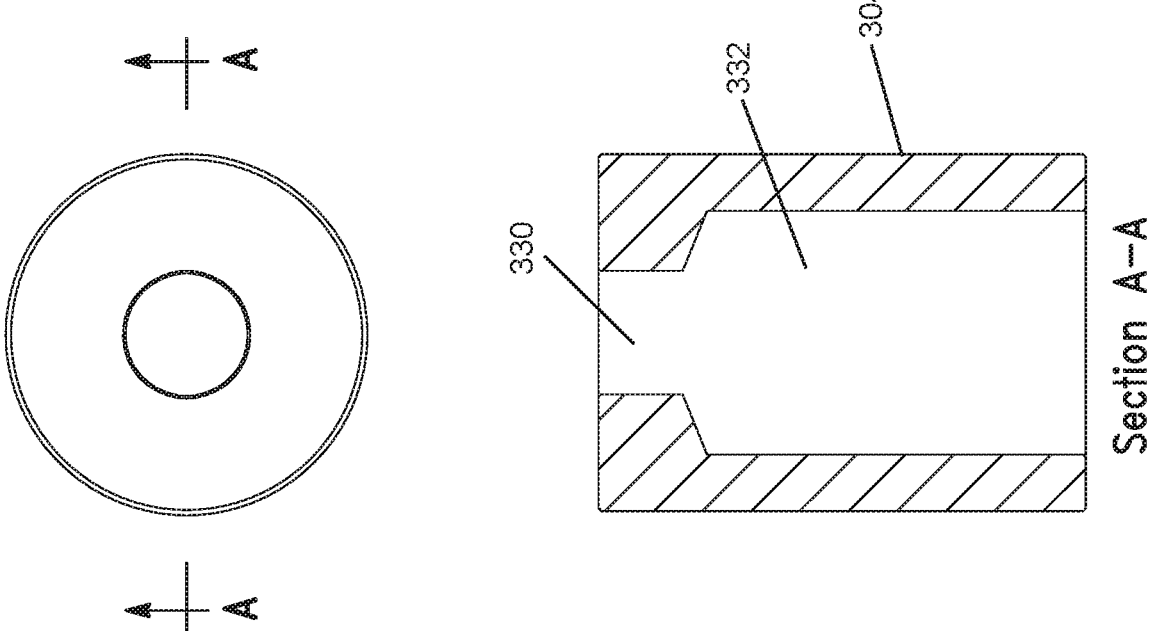
Section A—A

400

402

404

Detail A

Section A—A

Detail D

Detail E

See Detail E

Section A—A

Detail F

402

404

Detail E

400

402

404

See Detail F

B

B

C

C

See Detail D

Section B—B

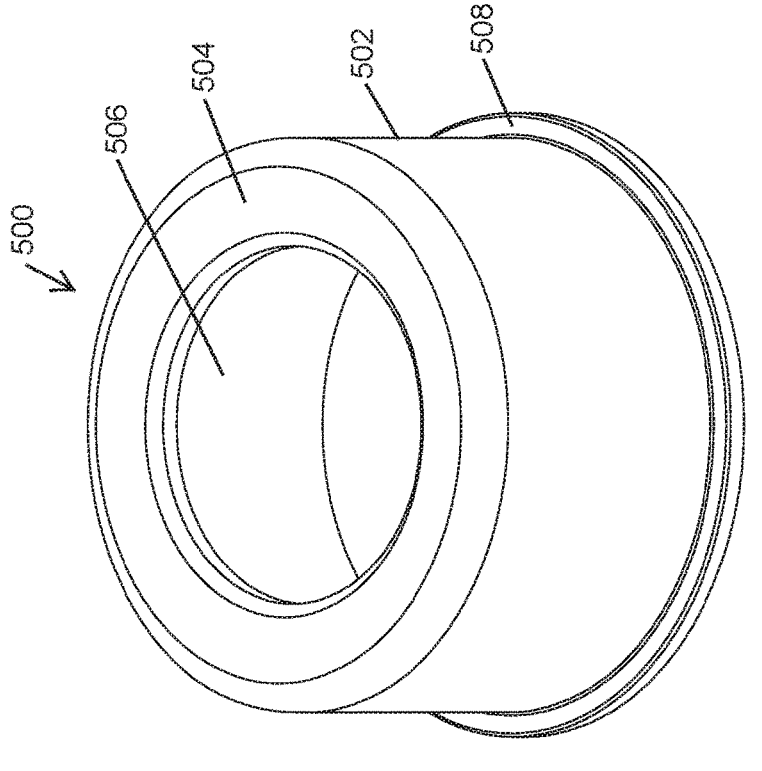
FIG. 6A
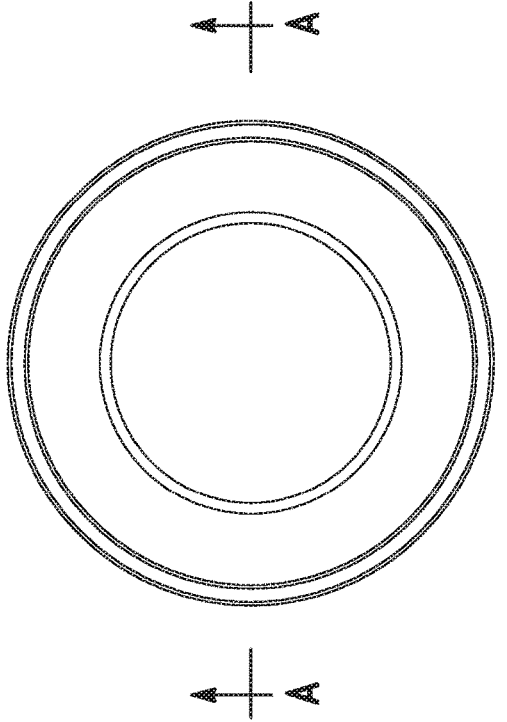
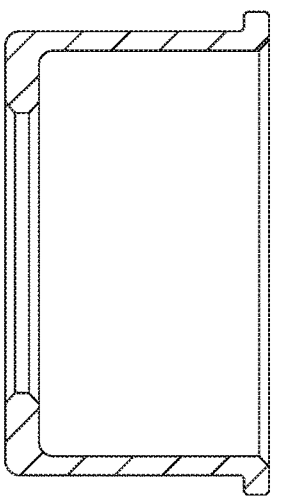
Section A—A

Section A–A

COIN-SLOT AND BALL-LOCK CERAMIC LIFT PIN HOLDERS

CROSS-REFERENCE TO RELATED APPLICATIONS

This application is a U.S. National Phase Application under 35 U.S.C. 371 of International Application No. PCT/US2020/057625, filed on Oct. 28, 2020, which claims the benefit of U.S. Provisional Application No. 62/939,252, filed on Nov. 22, 2019. The entire disclosures of the applications referenced above are incorporated herein by reference.

FIELD

The present disclosure relates generally to substrate processing systems, and more particularly to lift pin holder assemblies for substrate support assemblies used in processing chambers of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch, ash, clean or otherwise perform treatment of film on a substrate such as a semiconductor wafer. The substrate processing systems typically include a processing chamber, a gas distribution device, and a substrate support assembly. During processing, the substrate is arranged on the substrate support assembly. Different gas mixtures may be introduced into the processing chamber. Radio frequency (RF) plasma and/or heat may be used to activate chemical reactions.

Lift pins may be used to allow delivery and removal of the substrate from the processing chamber using a robot arm. Normally, an upper end of the lift pins is located flush with or below an upper surface of the substrate support assembly. During substrate delivery or removal, the lift pins are raised relative to an upper surface of the substrate support assembly to lift the substrate and provide clearance between the substrate and the substrate support assembly. The clearance between the substrate and the substrate support assembly allows an end effector of the robot arm to be inserted or removed.

A bottom portion of the lift pins is located in and retained by a lift pin holder. The lift pin holder is typically made of metal. The metal in the lift pin holder can cause metal contamination of the substrates during processing at high temperature and/or using certain process chemistries.

SUMMARY

A lift pin holder assembly comprises a base portion, a stem portion, and a top portion. The base portion includes a cavity at a center of the base portion. The cavity extends along a height of the base portion. The stem portion extends perpendicularly from the base portion along the height of the base portion. The cavity extends through a center of the stem portion along a height of the stem portion. The centers of the base and stem portions are collinear. The stem portion includes a ball lock arranged at a distal end of the stem portion and proximate to a portion of the cavity that is adjacent to the distal end of the stem portion. The top portion surrounds and is retained around the stem portion and includes an opening adjacent to the distal end of the stem portion coincident with the cavity.

In other features, the base, stem, and top portions are made of a ceramic material.

In other features, the lift pin holder assembly further comprises a lift pin having a first end inserted into the cavity in the stem portion trough the opening in the top portion. The first end including a circular groove. The lift pin is retained in the cavity in the stem portion by the ball lock locked into the circular groove. The lift pin has a second end extending out of the opening of the top portion along the height of the stem portion.

In other features, the base portion is cylindrical and has a first diameter, and the stem portion comprises a first cylindrical portion, a second cylindrical portion, and a ring shaped structure. The first cylindrical portion extends perpendicularly from the base portion along the height of the stem portion and has a second diameter that is less than the first diameter. The second cylindrical portion extends perpendicularly from the first cylindrical portion along the height of the stem portion and has a third diameter that is greater than the second diameter and less than the first diameter. The ring shaped structure surrounds the second cylindrical portion.

In other features, the second cylindrical portion includes a slot for the ball lock. The slot is located on an opposite side of the ring shaped structure relative to the first cylindrical portion.

In another feature, the ring shaped structure is located around a middle portion of the second cylindrical portion.

In other features, the top portion comprises a circular portion and a hollow cylindrical portion. The circular portion includes the opening at a center of the circular portion. The hollow cylindrical portion extends perpendicularly from the circular portion along the height of the stem portion. The hollow cylindrical portion mates with the second cylindrical portion and the ring shaped structure surrounding the second cylindrical portion.

In other features, the base portion has a first height. The stem portion has a second height that is greater than the first height.

In other features, the base portion is cylindrical and has a first diameter. The top portion is cylindrical, has a second diameter that is less than or equal to the first diameter, and has a third height that is less than the second height and greater than the first height.

In other features, the cavity is cylindrical and has a first diameter. The opening is circular and has a second diameter that is substantially equal to the first diameter. The cavity and the opening are aligned along the height of the stem portion.

In other features, the cavity is cylindrical and has a first diameter. The opening is circular and has a second diameter. The cavity and the opening are aligned along the height of the stem portion. The lift pin is cylindrical and has a third diameter than is less than the first and second diameters.

In still other features, a lift pin holder assembly comprises a base portion, a stem portion, and a top portion. The base portion includes a cavity at a center of the base portion. The cavity extends along a height of the base portion. The stem portion extends perpendicularly from the base portion along the height of the base portion. The stem portion is C-shaped. The stem portion defines a hollow portion extending through a center of the stem portion along a height of the stem portion. The hollow portion is coincident with the cavity.

The centers of the base and stem portions are collinear. The top portion surrounds the stem portion and includes an opening adjacent to a distal end of the stem portion coincident with the cavity.

In other features, the base, stem, and top portions are made of a ceramic material.

In other features, the lift pin holder assembly further comprises a lift pin having a first end inserted into the hollow portion in the stem portion through the opening in the top portion. The first end includes a circular groove. The lift pin is retained in the hollow portion by an inner radial portion of the stem portion at the distal end locked into the circular groove. The lift pin has a second end extending out of the opening of the top portion along the height of the stem portion.

In other features, the base portion is cylindrical, and the top portion comprises a circular portion, a cylindrical portion, and a second cavity. The circular portion includes the opening at a center of the circular portion. The cylindrical portion extends perpendicularly from the circular portion along the height of the stem portion. The second cavity in the cylindrical portion mates with the stem portion.

In other features, the base portion is cylindrical and has a first diameter and a first height. The stem portion has second diameter that is less than the first diameter and has a second height that is greater than the first height.

In other features, the top portion is cylindrical, has a third diameter that is less than or equal to the first diameter and that is substantially equal to the second diameter, and has a third height that is less than the second height and greater than the first height.

In other features, the cavity is cylindrical and has a first diameter. The opening is circular and has a second diameter that is substantially equal to the first diameter. The cavity and the opening are aligned along the height of the stem portion.

In other features, the cavity is cylindrical and has a first diameter. The opening is circular and has a second diameter. The cavity and the opening are aligned along the height of the stem portion. The lift pin is cylindrical and has a third diameter than is less than the first and second diameters.

In still other features, an apparatus comprises an annular ring and a plurality of slots arranged on the top surface of the annular ring. The annular ring has an outer diameter and an inner diameter. The annular ring has top and bottom surfaces defining a thickness of the annular ring. Each of the slots has a depth less than the thickness of the annular ring. Each of the slots is defined by two parallel lines and an arc-shaped element. The two parallel lines extend at the depth in a plane parallel to the top surface of the annular ring from the outer diameter of the annular ring towards the inner diameter of the annular ring. The distal ends of the two parallel lines bends towards each other at an acute angle. The arc-shaped element extends at the depth in the plane from the distal ends of the two parallel lines towards the inner diameter of the annular ring.

In another feature, top of each of the slots is level with the top surface of the annular ring.

In another feature, the annular ring is made of a ceramic material.

In other features, the apparatus further comprises a lift pin holder assembly arranged in a slot of the plurality of slots. The lift pin holder assembly comprises a cylindrical base portion and a step portion. The cylindrical base portion is arranged in the slot. The stem portion extends perpendicularly from the cylindrical base portion along a height of the lift pin holder assembly and retains a lift pin inserted into the stem portion.

In another feature, the stem portion includes a ball lock at a distal end that locks into a circular groove on the lift pin.

In another feature, the stem portion includes an inner radial portion at a distal end that locks into a circular groove on the lift pin.

In another feature, the apparatus further comprises a retainer surrounding the cylindrical base portion and retaining the lift pin holder assembly in the slot. The retainer is cylindrical and has a diameter equal to a distance between the two parallel lines of the slot and a circumference mating the arc-shaped element of the slot.

In other features, the retainer comprises a circular portion and a cylindrical portion. The circular portion is parallel to the top surface of the annular ring. The circular portion includes an opening at a center through which the stem portion of the lift pin holder assembly and the lift pin extend perpendicularly away from the top surface of the annular ring along a height of the lift pin holder assembly. The cylindrical portion extends perpendicularly from the circular portion towards the top surface of the annular ring. The cylindrical portion surrounds the cylindrical base portion of the lift pin holder assembly.

In other features, the apparatus further comprises an aperture and a T-shaped element. The aperture is arranged in the slot proximate to an intersection of one of the two parallel lines and the outer diameter of the annular ring. The T-shaped element includes a first portion that is perpendicular to the top surface of the annular ring and that is inserted into the aperture. The T-shaped element includes a second portion that is parallel to the top surface of the annular ring and perpendicular to the first portion and that extends into a radially outward path of the retainer retaining the lift pin holder assembly in the slot.

In other features, the first portion of the T-shaped element is cylindrical. The second portion of the T-shaped element is rectangular.

In another feature, the apparatus further comprises a substrate support assembly. The annular ring is arranged on a base of the substrate support assembly.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A and 4B show a fork lock type ceramic lift pin holder assembly for use with the substrate support assembly of FIG. 2;

FIGS. 6A and 6B show examples of retainers that can be used to retain the ball lock and fork lock type lift pin holder assemblies in the coin slot type structures shown in FIGS. 5A-5C.

In the drawings, reference numbers may be reused to identify similar and/or identical elements.

DETAILED DESCRIPTION

The present disclosure provides ceramic lift pin holders and retainer mechanisms that eliminate the need for any flexible materials and that can be fabricated entirely from ceramic materials. Specifically, the present disclosure provides a mechanical design that allows installation of lift pin holders with only one hand and by feel, without the need to see the part and its mating mechanism. One of the described designs fits into nominal-size mating holders, creating a puzzle-like retention lock on the lift pin holder.

Current mechanical designs used for this purpose employ flexible, metallic spring retention designs to enable the single-handed installation process. The metal composition of these springs are prone to extreme corrosion when exposed to process chemicals commonly present in processing chambers. Protective coatings applied to these springs and metal parts can delay onset of this corrosion but are typically consumed over time, and only delay the corrosive degradation. The resulting corrosion forms metal-containing flakes and particles which can contaminate deposited films or result in mechanical defects on-wafer. Continued use can eventually result in more severe failures where the wafer handling pins are no longer retained and interfere with wafer placement or movement.

The new design according to the present disclosure replaces all metal components with ceramic components. The new design replicates the single-hand installation functionality with ceramic parts. The new design allows an interference-lock mechanism to work together with a non-sliding mechanism that locks in place by expanding and being locked into place as explained below.

The present disclosure is organized as follows. Initially, examples of substrate processing systems are shown and described with reference to FIGS. 1A and 1B. An example of a substrate support assembly including a lift pin holder assembly is shown and described with reference to FIG. 2. A ball lock type ceramic lift pin holder assembly is shown and described with reference to FIGS. 3A-3D. A fork lock type ceramic lift pin holder assembly is shown and described with reference to FIGS. 4A and 4B. A ring shaped platform with coin slot type structures in which the ball lock and fork lock type lift pin holder assemblies can be installed is shown and described with reference to FIGS. 5A-5C. Examples of retainers that can be used to retain the ball lock type and fork lock type lift pin holder assemblies in the coin slot type structures are shown and described with reference to FIGS. 6A and 6B. A T-shaped retainer that can prevent the retainers from sliding out of the coin slot type structures is shown and described with reference to FIG. 7.

Figure 1A:
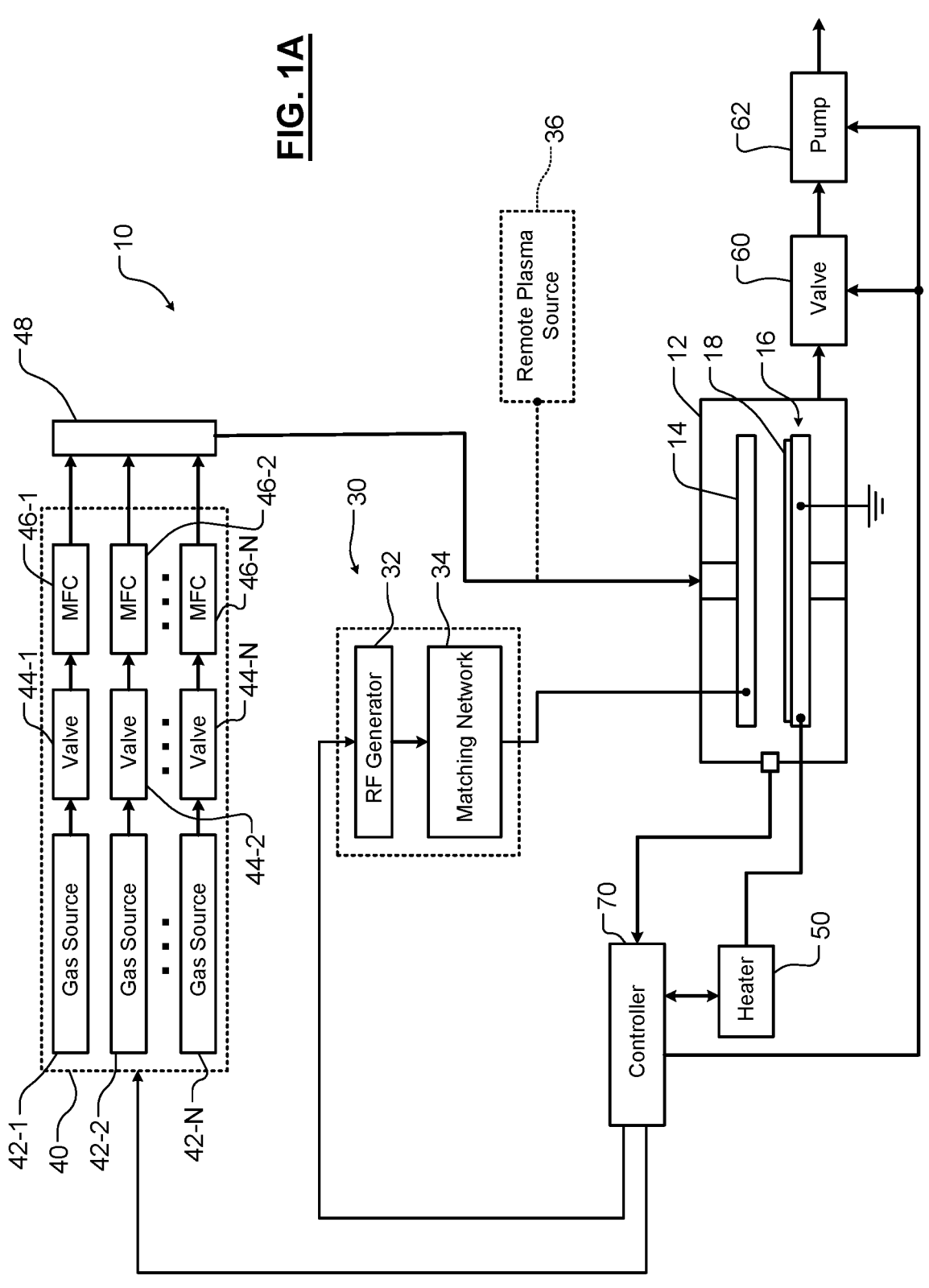
FIGS. 1A and 1B show examples of substrate processing systems.

FIG. 1A shows a substrate processing system 10 including a processing chamber 12 that encloses other components of the substrate processing system 10 and contains RF plasma (if used). The substrate processing system 10 includes a showerhead 14 and a substrate support assembly 16. A substrate 18 is arranged on the substrate support assembly 16. The showerhead 14 introduces and distributes process gases during processing of the substrate 18.

If plasma is used, the plasma can be direct or remote plasma. In this example, an RF generating system 30 generates and outputs an RF voltage to either the showerhead 14 or the substrate support assembly 16 (the other is DC grounded, AC grounded, or floating). For example only, the RF generating system 30 may include an RF voltage generator 32 that generates the RF voltage that is fed by a matching network 34 to the showerhead 14 or the substrate support assembly 16. Alternately, the plasma may be delivered by a remote plasma source 36.

A gas delivery system 40 includes one or more gas sources 42-1, 42-2, . . . , and 42-N (collectively gas sources 42), where N is a positive integer. The gas sources 42 supply one or more etch gas mixtures, precursor gas mixtures, cleaning gas mixtures, ashing gas mixtures, etc. to the processing chamber 12. Vaporized precursor may also be used. The gas sources 42 are connected by valves 44-1, 44-2, . . . , and 44-N (collectively valves 44) and mass flow controllers 46-1, 46-2, . . . , and 46-N (collectively mass flow controllers 46) to a manifold 48. An output of the manifold 48 is fed to the processing chamber 12. For example only, the output of the manifold 48 is fed to the showerhead 14.

A heater 50 may be connected to a heater coil (not shown) arranged in the substrate support assembly 16. The heater 50 may be used to control a temperature of the substrate support assembly 16 and the substrate 18. A valve 60 and pump 62 may be used to evacuate reactants from the processing chamber 12. A controller 70 may be used to control components of the substrate processing system 10. For example only, the controller 70 may be used for controlling flow of process gases, monitoring process parameters such as temperature, pressure, power, etc., striking and extinguishing plasma, removing reactants, etc.

Figure 1B:
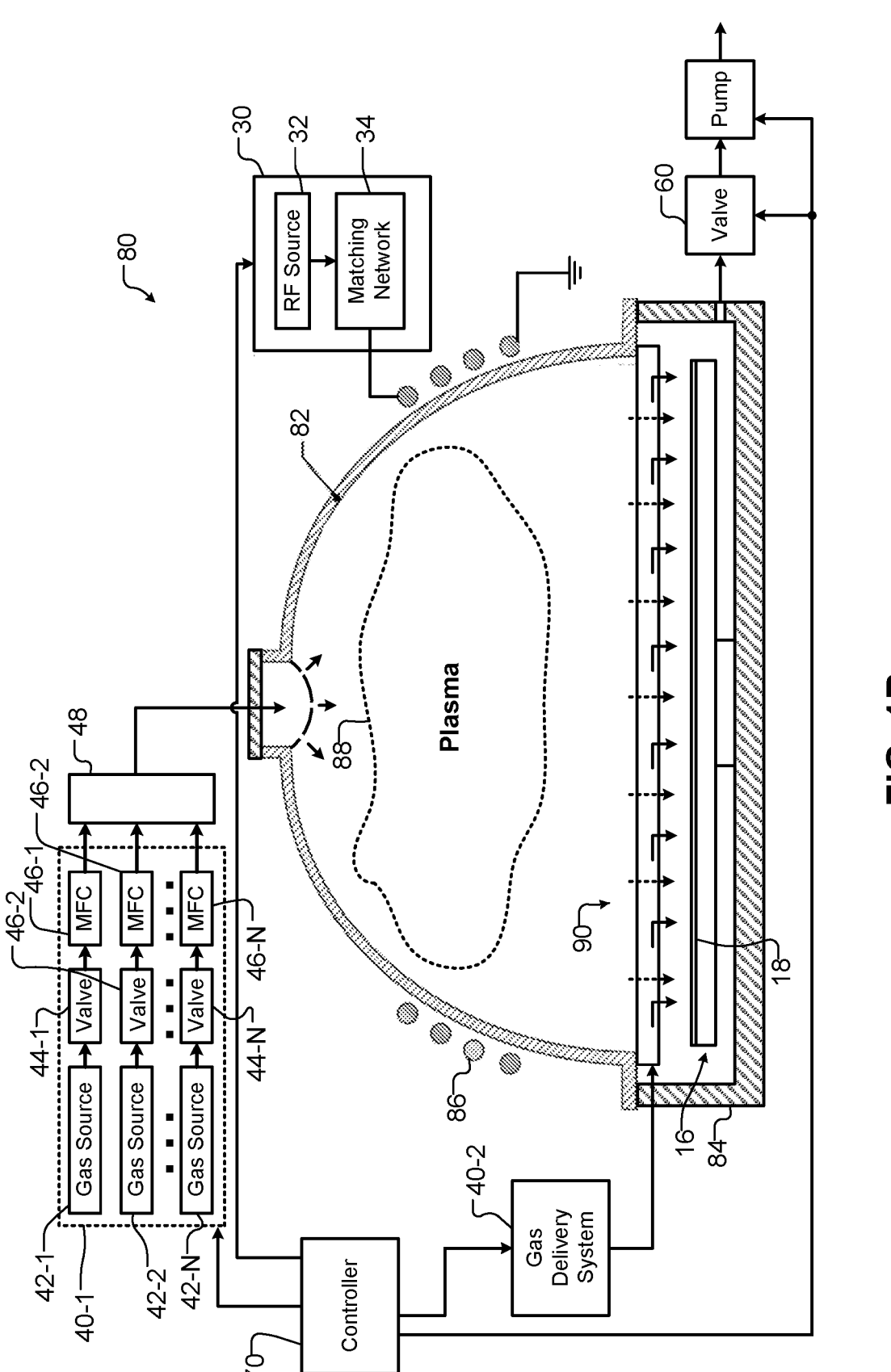

FIG. 1B shows another example of a substrate processing chamber 80 including an upper chamber 82 and a lower chamber 84 that includes the substrate support assembly 16. An inductive coil 86 is arranged around the upper chamber 82. The RF generating system 30 outputs RF power to the inductive coil 86 to create plasma 88 in the upper chamber 82. A showerhead 90 filters ions and delivers radicals to the lower chamber 84. The showerhead 90 may also be used to supply secondary gas such as precursor gas from a gas delivery system 40-2 to the lower chamber 84.

While two examples of substrate processing systems are shown, the lift pin holder assemblies described herein can be used with any other type of substrate processing system.

Figure 2:
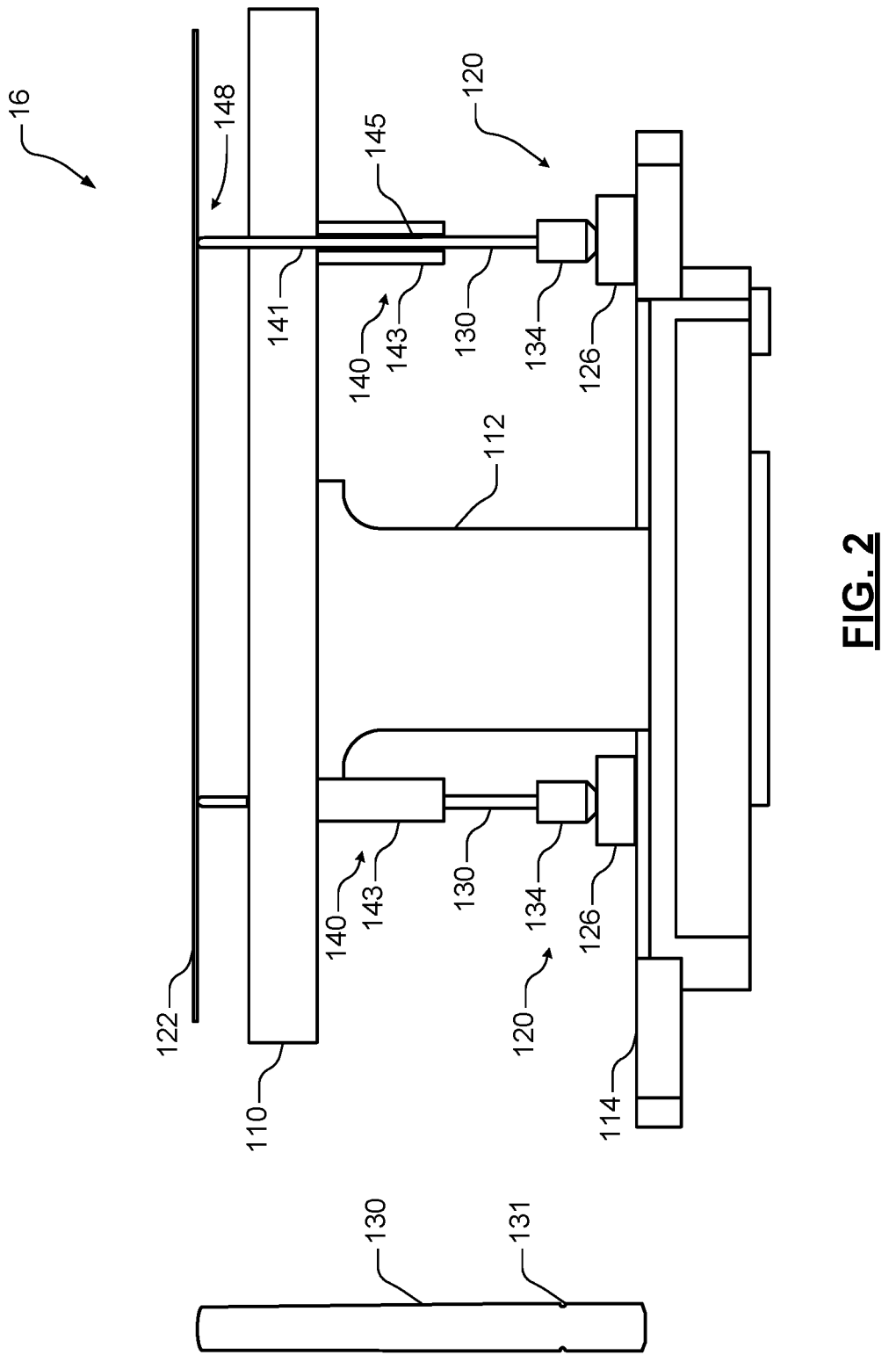
FIG. 2 shows an example of a substrate support assembly used in the substrate processing systems of FIGS. 1A and 1B.

FIG. 2 shows the substrate support assembly 16 in further detail. The substrate support assembly 16 may be arranged in a processing chamber such as those shown in FIGS. 1A and 1B or any other substrate processing chamber. The substrate support assembly 16 includes a substrate supporting plate 110, a supporting column 112, and a base 114. The base 114 may include a ring shaped platform (also called a lift ring) with coin slot type structures (shown in FIGS. 5A-5C) in which the ball lock and fork lock holder assemblies of the present disclosure can be installed. In some examples, the supporting column 112 moves relative to the base 114.

Lift pin holder assemblies 120 (shown generically here and specifically later in FIGS. 3A-4B) are arranged below the substrate supporting plate 110 on the base 114. The lift pin holder assembly 120 includes a base portion 126, a lift pin 130, and a lift pin holder 134. In some examples, the lift pin holder assembly 120 and the lift pin 130 are generally cylindrically shaped. The lift pin 130 includes a circular groove 131, which is useful in locking the lift pin 130 into the lift pin holder assemblies described with reference to FIGS. 3A-4B below.

One or more guiding elements 140 may be used to help guide the lift pin 130. In some examples, the guiding elements 140 include a cylindrical support 143 that is attached to a bottom surface of the substrate supporting plate 110. The cylindrical support 143 includes a bore 145 for receiving a middle portion the lift pin 130. Likewise, the substrate supporting plate 110 includes a bore 141 for receiving an upper portion of the lift pin 130.

During use, the supporting column 112 and/or the base 114 may be raised and lowered relative to the substrate supporting plate 110 to vary a height of the upper end of the lift pins 130 relative to an upper surface of the substrate supporting plate 110. As a result, the lift pins 130 lift the substrate 122 above the substrate supporting plate 110 or are positioned to receive the substrate 122 to be loaded onto the substrate supporting plate 110. Clearance is provided between the substrate 122 and the upper surface of the substrate supporting plate 110 as shown at 148.

Figure 5A:
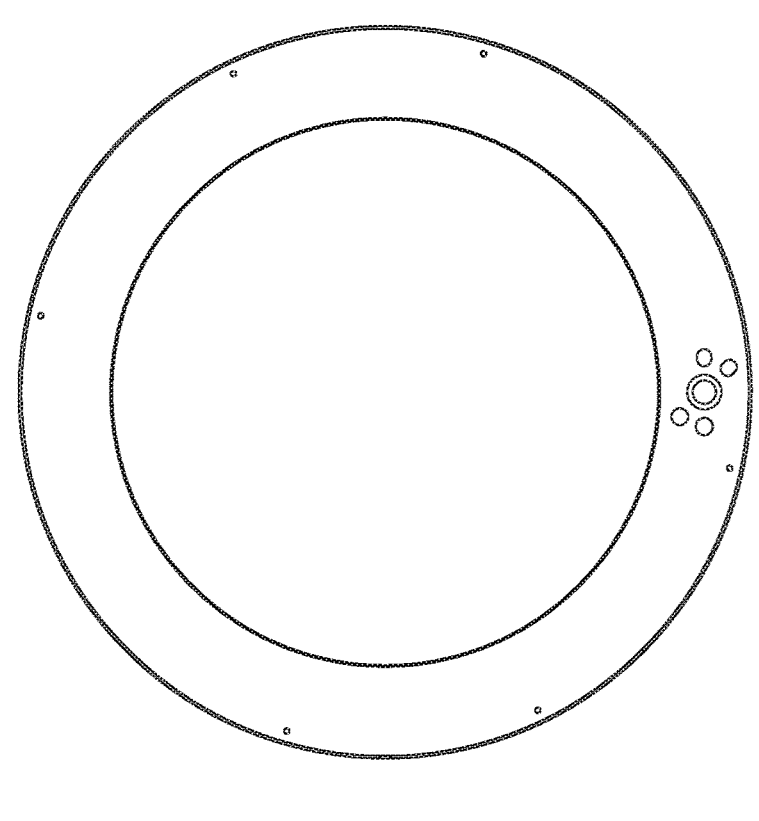
FIGS. 5A-5C show a ring shaped platform with coin slot type structures in which the ball lock and fork lock type lift pin holder assemblies can be installed for use with the substrate support assembly of FIG. 2.
Figure 5A:
Figure 5A:
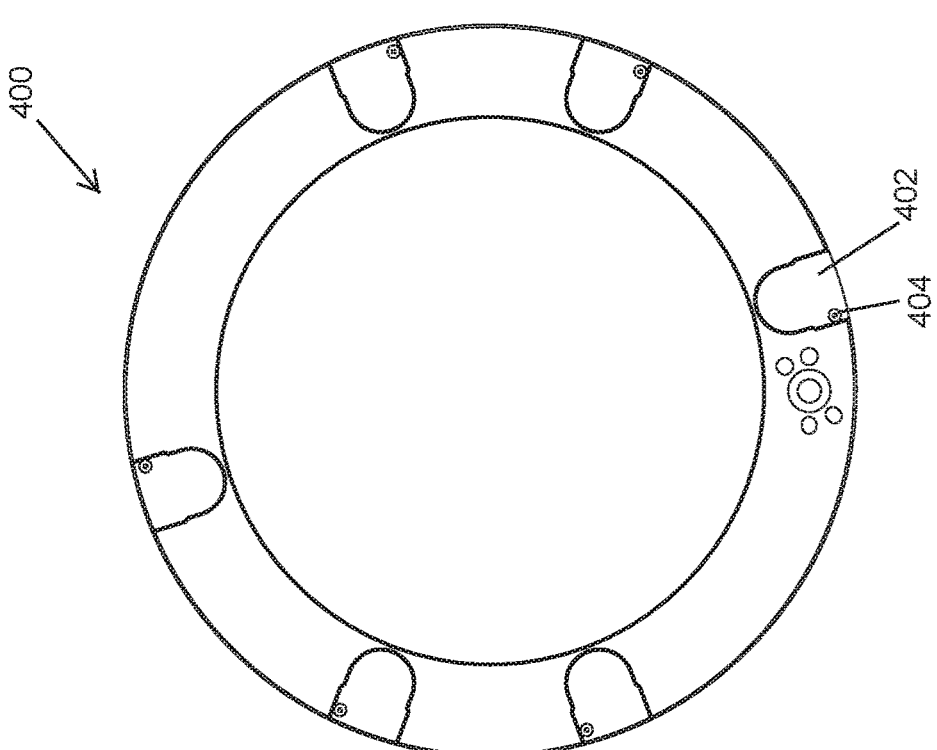
Figure 5B:
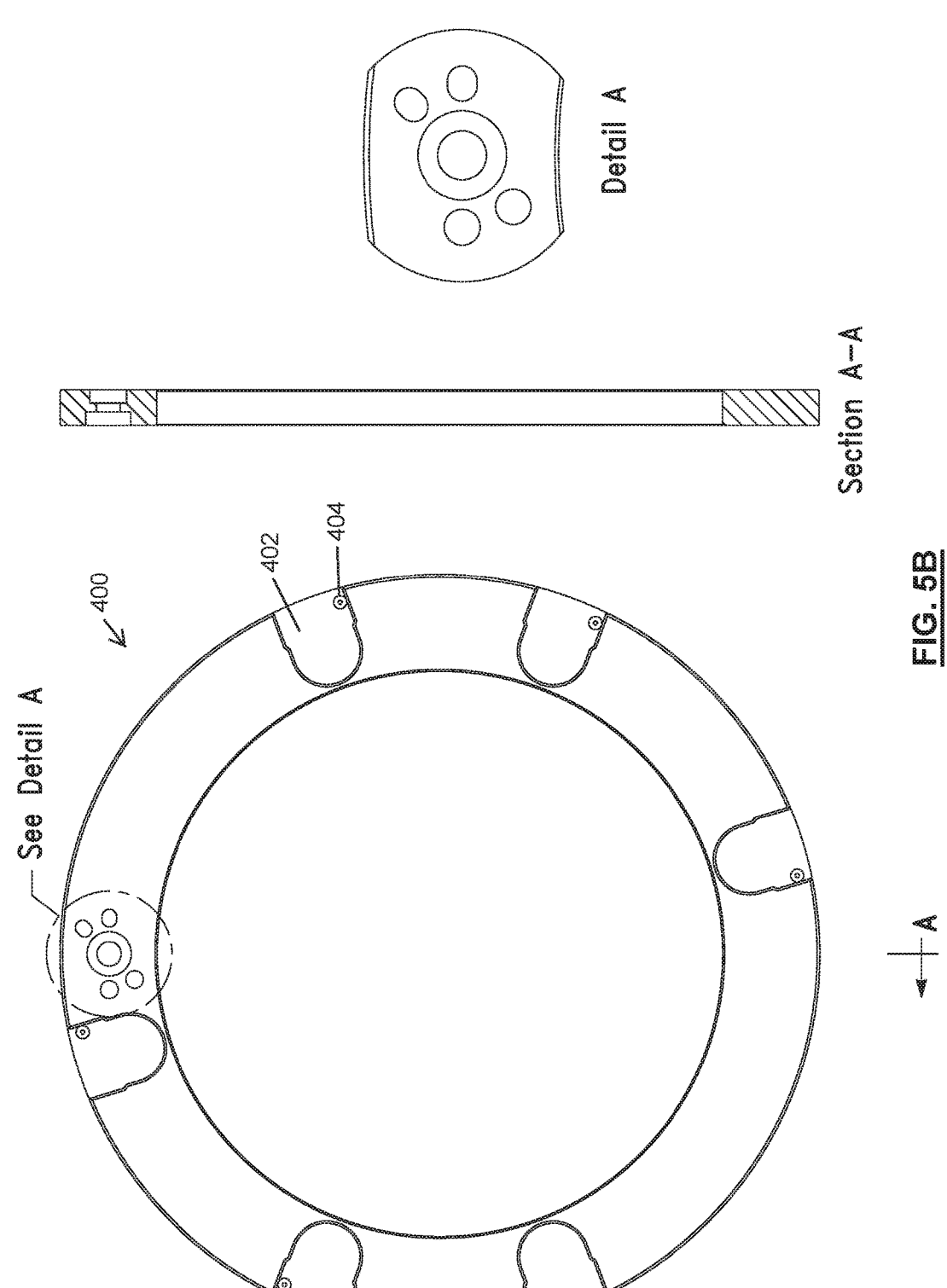
Figure 5C:
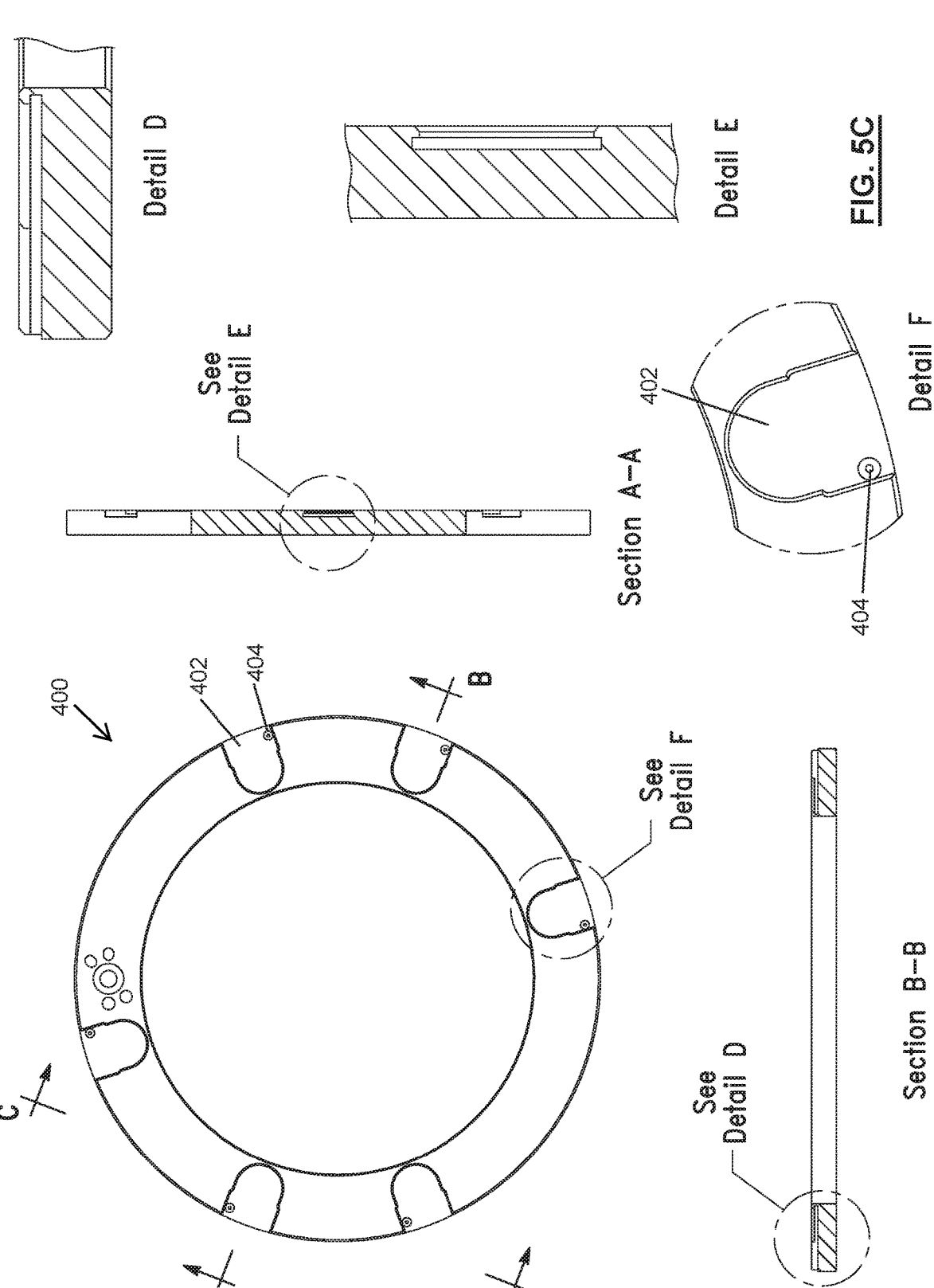
Figure 6B:
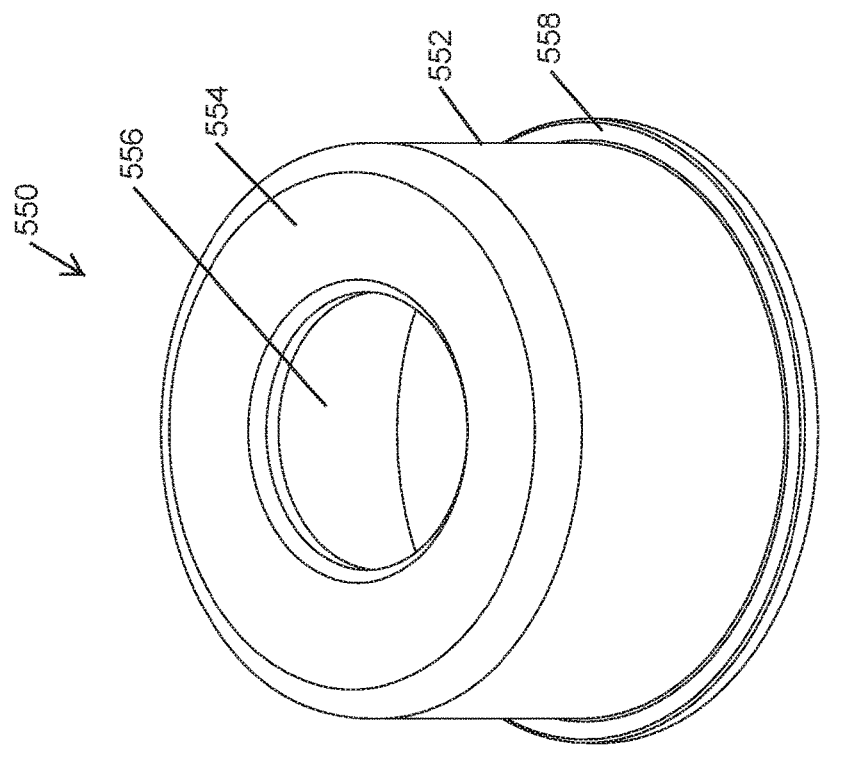
Figure 6B:
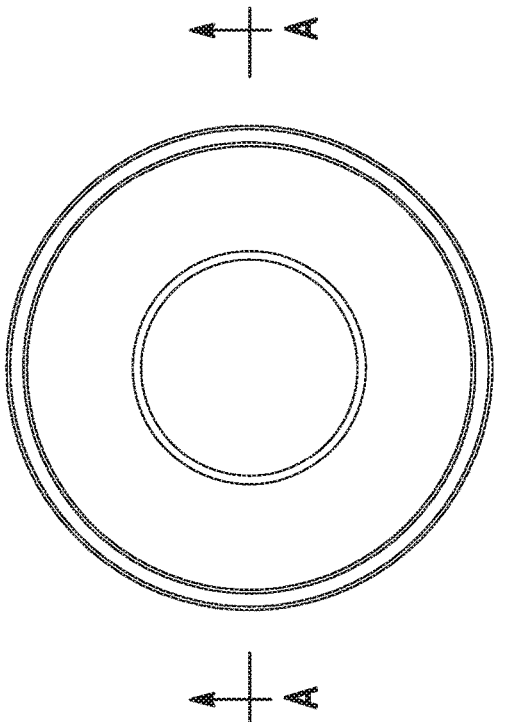
Figure 6B:
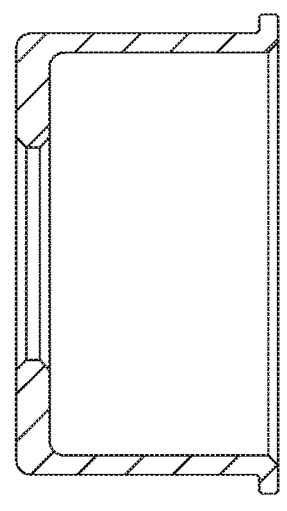
Figure 7:
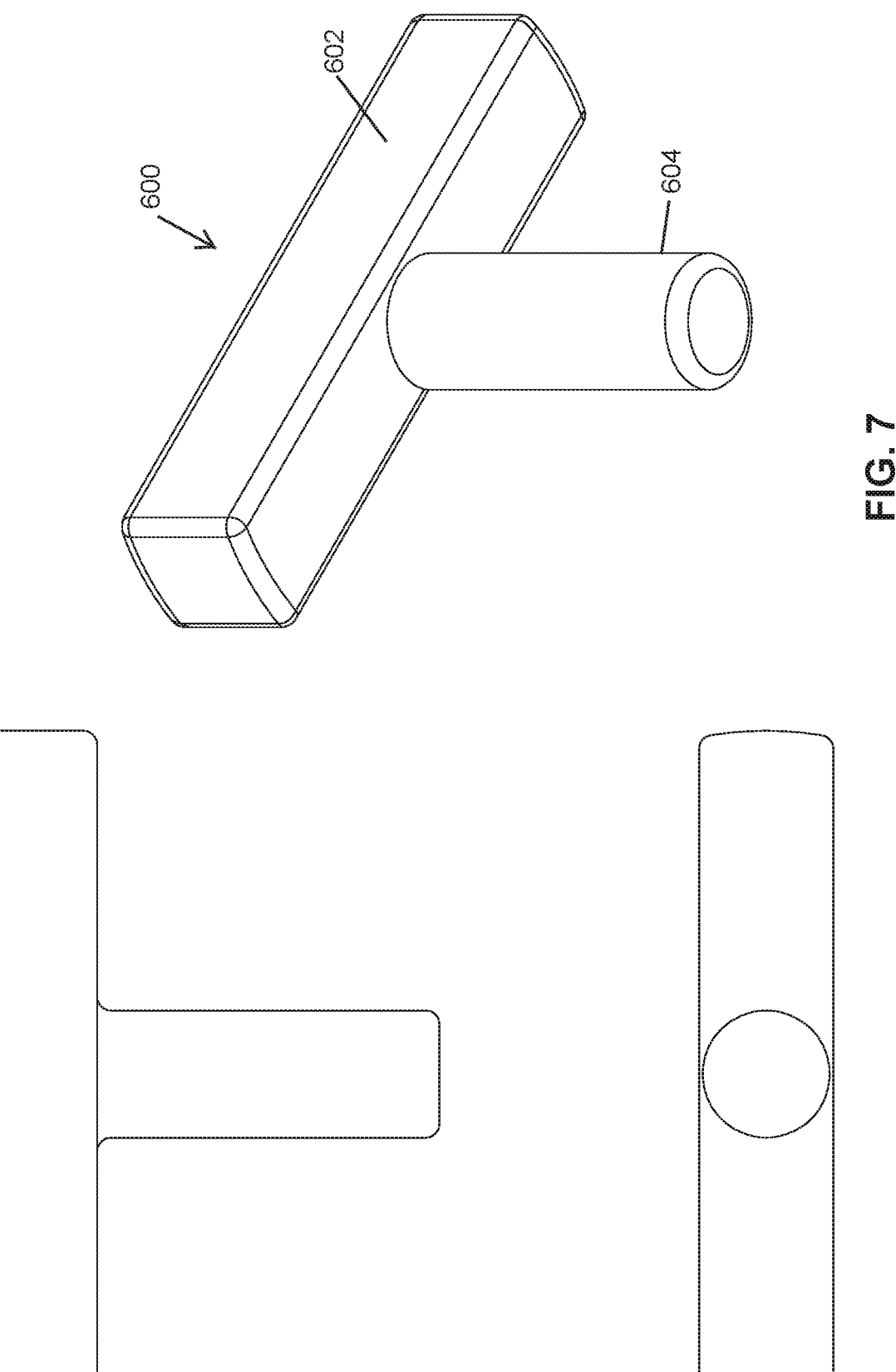
FIG. 7 shows a T shaped retainer that can prevent the retainers of FIGS. 6A and 6B from sliding out of the coin slot type structures shown in FIGS. 5A-5C.

FIGS. 3A-7 show various examples and components of the lift pin holder assembly 120 and retainers in detail. FIGS. 3A-3D show a ball lock holder assembly. FIGS. 4A and 4B show a fork lock holder assembly. FIGS. 5A-5C show a ring shaped platform with coin slot type structures (also called a lift ring) in which the ball lock and fork lock holder assemblies can be installed. FIGS. 6A and 6B show retainers that can retain the ball lock and fork lock holder assemblies in the coin slot type structures. FIG. 7 shows a T shaped retainer structure that can prevent the retainers from sliding out of the coin slot type structures.

All of the structures, assemblies, and components shown in FIGS. 3A-7 are made of non-metallic material. For example, all of the structures, assemblies, and components shown in FIGS. 3A-7 are made of a ceramic material. Further, the lift pin 130 is also made of a non-metallic material.

Figure 3B:
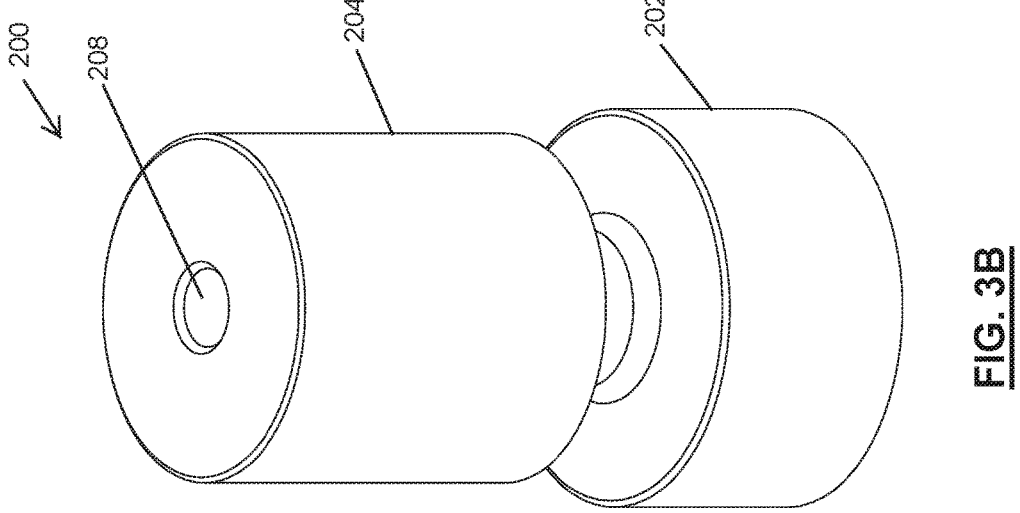
FIGS. 3A-3D show a ball lock type ceramic lift pin holder assembly for use with the substrate support assembly of FIG. 2.
Figure 3A:
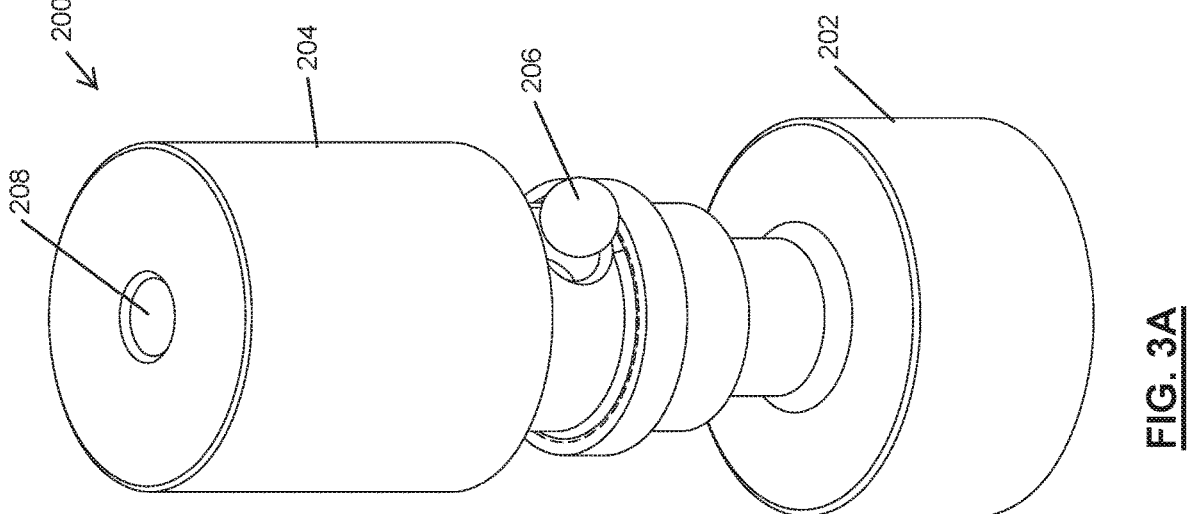

FIGS. 3A-3D show a ball lock holder assembly 200. In FIGS. 3A and 3B, the ball lock holder assembly 200 comprises a base portion 202 and a top portion (also called a cap) 204. The base portion 202 includes a ball lock 206 to lock the lift pin 130 when the lift pin 130 is inserted into the base portion 202 as explained below. The top portion 204 is installed on the base portion 202 by sliding down the top portion 204 over the ball lock 206. When the top portion 204 slides over the ball lock 206, the top portion 204 locks into the base portion 202 via a ring shaped structure (element 218 described below) that radially protrudes from the stem of the base portion and that mates with a corresponding element 234 in the top portion 204 as explained below.

FIG. 3A shows the ball lock holder assembly 200 with the top portion 204 not fully installed onto (i.e., not locked into) the base portion 202. FIG. 3B shows the ball lock holder assembly 200 with the top portion 204 fully installed onto (i.e., locked into) the base portion 202.

With the top portion 204 fully installed onto (i.e., locked into) the base portion 202 (i.e., when elements 218 and 234 of the base and top portions 202, 204 are mated together), the lift pin 130 can be inserted into the ball lock holder assembly 200 through an opening 208 in the top portion 204. After the lift pin 130 is inserted through the opening 208 down towards the base portion 202, the lift pin 130 is locked into the ball lock holder assembly 200 by slightly pulling up the top portion 204. A ring shaped groove 131 around the lift pin 130 (shown in FIG. 2) slides over the ball lock 206 and locks into the ball lock 206. To unlock and release the lift pin 130 from the ball lock holder assembly 200, the top portion 204 is slightly pulled up, and the lift pin 130 is removed from the ball lock holder assembly 200. The ring shaped groove 131 around the lift pin 130 is unlocked and released from the ball lock 206.

Figure 3C:
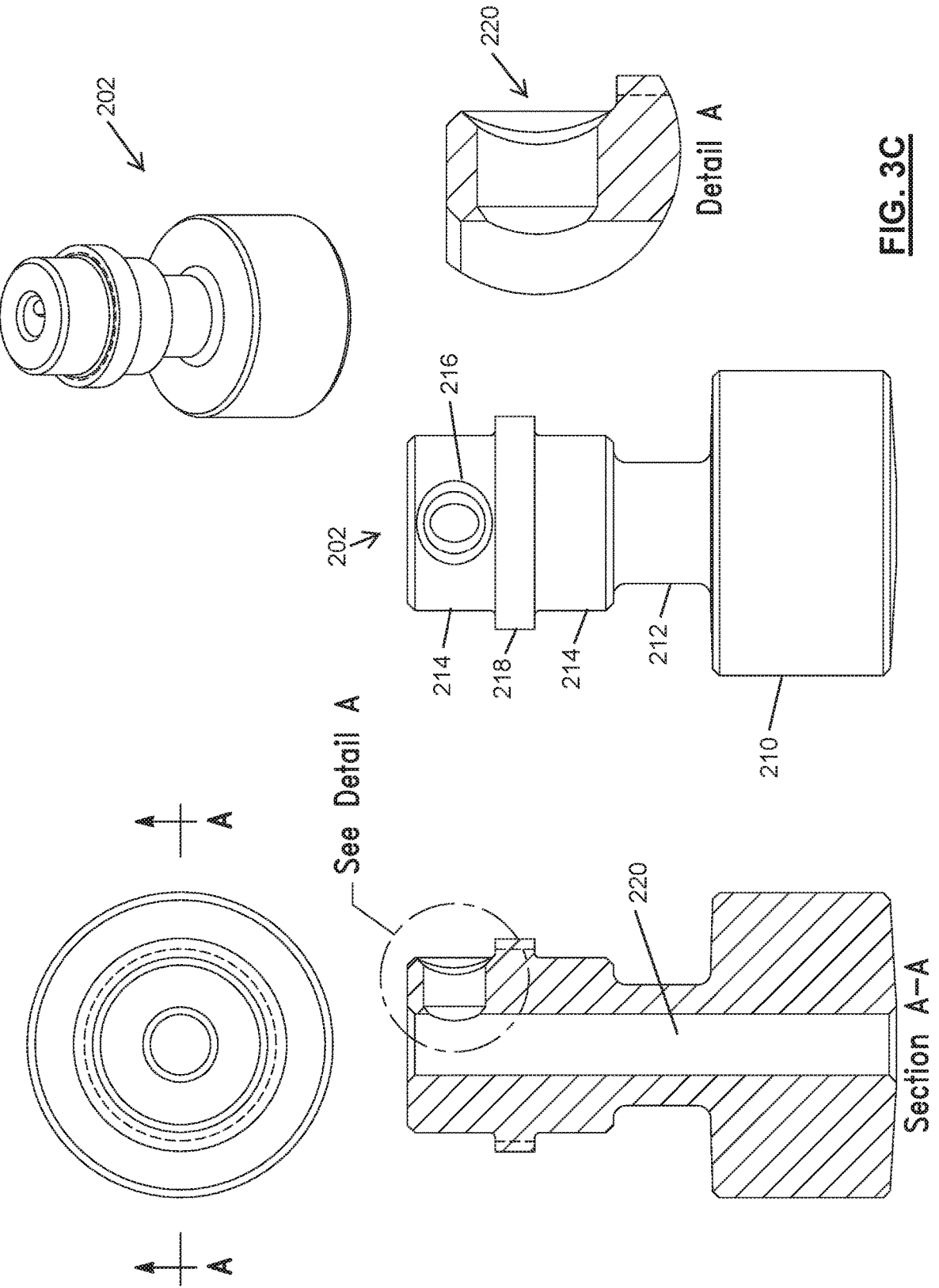

FIG. 3C shows the base portion 202 of the ball lock holder assembly 200 in further detail. FIG. 3C shows various views of the base portion 202. While the base portion 202 is geometrically described below in terms of (i.e., as comprising) various portions and structures, the base portion 202 is one piece (i.e., a single integrated structure).

The base portion 202 comprises a first cylindrical portion 210 having a first diameter d1. The first cylindrical portion 210 defines a lower portion (or base) of the base portion 202. The base portion 202 further comprises a second cylindrical portion 212 having a second diameter d2 that extends perpendicularly from the first cylindrical portion 210 (i.e., along the height of the base portion 202 or the height of the ball lock holder assembly 200), where d2<d1.

The base portion 202 further comprises a third cylindrical portion 214 having a diameter d3 that extends coaxially from the second cylindrical portion 212 (i.e., perpendicularly relative to the first cylindrical portion 210, and along the height of the base portion 202 or the height of the ball lock holder assembly 200), where d1>d3>d2. The third cylindrical portion 214 is longer (i.e., has a greater height) than the second cylindrical portion 212.

The base portion 202 further comprises a receptacle (or slot) 216 for the ball lock 206 at a distal end of the third cylindrical portion 214. That is, the third cylindrical portion 214 comprises the receptacle 216 at its distal end. The receptacle 216 is shown in detail at 222. The ball lock 206 is arranged in the receptacle 216.

The base portion 202 further comprises a ring shaped structure 218 having a diameter d4 that surrounds a middle portion of the third cylindrical portion 214, where d1>d4>d3. The ring shaped structure 218 extends or protrudes radially outwardly generally (i.e., perpendicularly to the height of the base portion 202 or the height of the ball lock holder assembly 200) from a midpoint of the third cylindrical portion 214. The ring shaped structure 218 is adjacent to the receptacle 216. The first and second cylindrical portions 210, 212 are on the opposite side of the ring shaped structure 218 relative to the receptacle 216.

The base portion 202 is hollow at the center and includes a cylindrical cavity (or bore) 220 at the center along the length (i.e., height) of the base portion 202. That is, the cylindrical cavity 220 runs through centers of elements 210, 212, 214, and 218 of the base portion 202 along the length (i.e., height) of the base portion 202.

The ball lock 206 is arranged in the receptacle 216 and is adjacent or proximate to a portion of the cylindrical cavity 220 that is near the distal end of the third cylindrical portion 214 of the base portion 202. The cylindrical cavity 220 receives the lift pin 130 when the lift pin 130 is inserted into the ball lock holder assembly 200 through the opening 208 in the top portion 204 (shown in FIGS. 3A and 3B).

Accordingly, the base portion 202 may be generally described as comprising the first cylindrical portion 210 and a stem portion 211 comprising elements 212-218. That is, elements 212-218 may be collectively called a stem portion 211 of the base portion 202. The stem portion 211 extends perpendicularly from the first cylindrical portion 210 along the height of the base portion 202. The cylindrical cavity 220 extends through centers of elements 210 and 211 along the height of the base portion 202. The ball lock 206 and its receptacle 216 are located at a distal end of the stem portion 211 and proximate to the portion of the cylindrical cavity 220 that is near the distal end of the stem portion 211. Again, the elements 210-220 are integral to the base portion 202 and define the base portion 202 as a single piece.

Figure 3D:
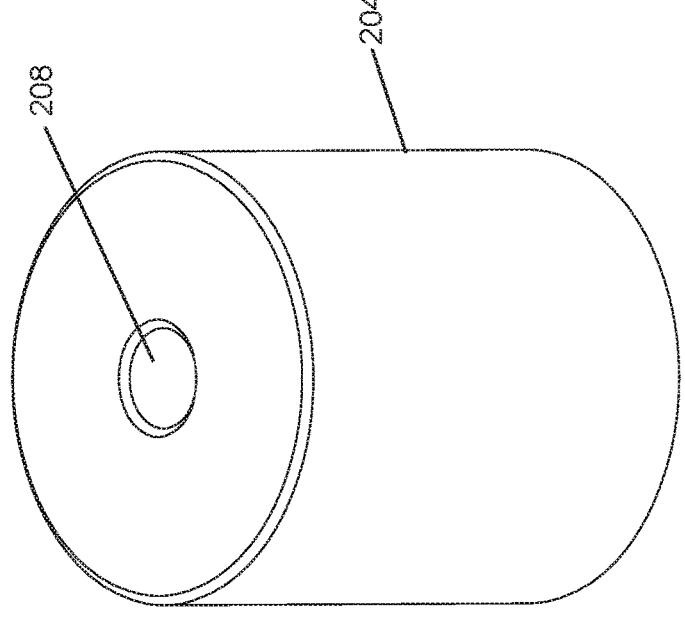
Figure 3D:
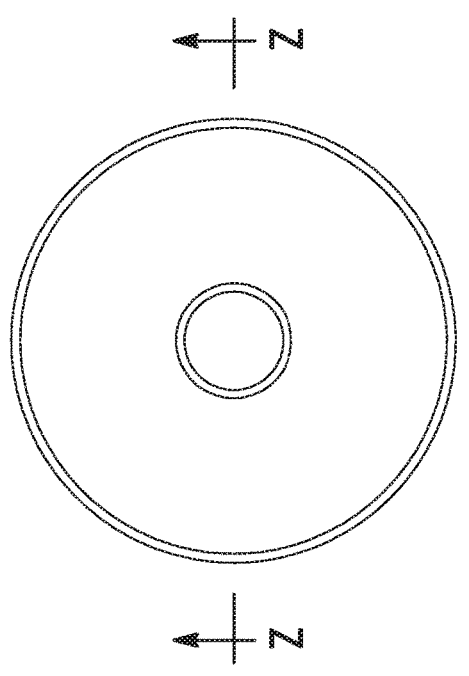
Figure 3D:
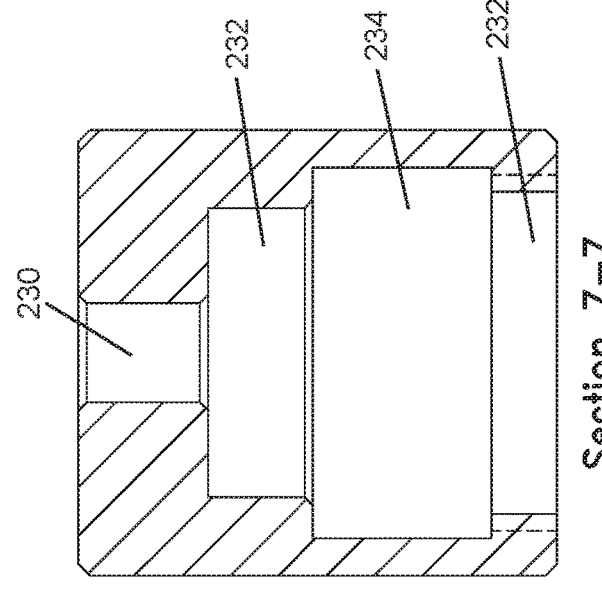

FIG. 3D shows the top portion 204 of the ball lock holder assembly 200 in further detail. The top portion 204 is cylindrical in shape and comprises multiple hollow structures that mate with the third cylindrical portion 214 and the ring shaped structure 218 of the base portion 202. Again, while the top portion 204 is geometrically described below in terms of (i.e., as comprising) various portions and structures, the top portion 204 is one piece (i.e., a single integrated structure).

The outer diameter of the top portion 204 may be less than d1. The height of the top portion 204 is greater than the height of the first cylindrical portion 210 of the base portion 202 and is less than the combined height of the second and third cylindrical portions 212, 214 of the base portion 202 (i.e., less than the height of the stem portion 211).

The top portion 204 comprises the opening 208. The opening 208 has a diameter a1 that matches the diameter of the lift pin 130. The top portion 204 comprises a first cylindrical hollow portion 230 having the diameter a1 that extends from the opening 208 along the center (i.e., along the axis of the cylindrical shape or the height) of the top portion 204. The top portion 204 further comprises a second cylindrical hollow portion 232 having a diameter a2 that extends from a distance x1 from the opening 208 along the center (i.e., along the axis of the cylindrical shape or the height) of the top portion 204, where a2>a1.

The top portion 204 further comprises a third cylindrical hollow portion 234 having a diameter a3 that enlarges a middle portion of the second cylindrical hollow portion 232 (i.e., extends radially or perpendicularly to the height of the top portion 204), where a3>a2. The third cylindrical hollow portion 234 mates with and surrounds the ring shaped structure 218 of the base portion 202 when the top portion 204 is installed on and locks into the base portion 202. The opening 208 aligns with the cylindrical cavity (or bore) 220 near the top of the base portion 202 when the top portion 204 is installed on and locks into the base portion 202.

The first, second, and third cylindrical hollow portions 230, 232, 234 of the top portion 204 define a single hollow portion or cavity in the top portion 204. The single hollow portion or cavity in the top portion 204 extends from the opening 208 at one (top) end of the top portion 204 to the other (bottom) end of the top portion 204.

Figure 4A:
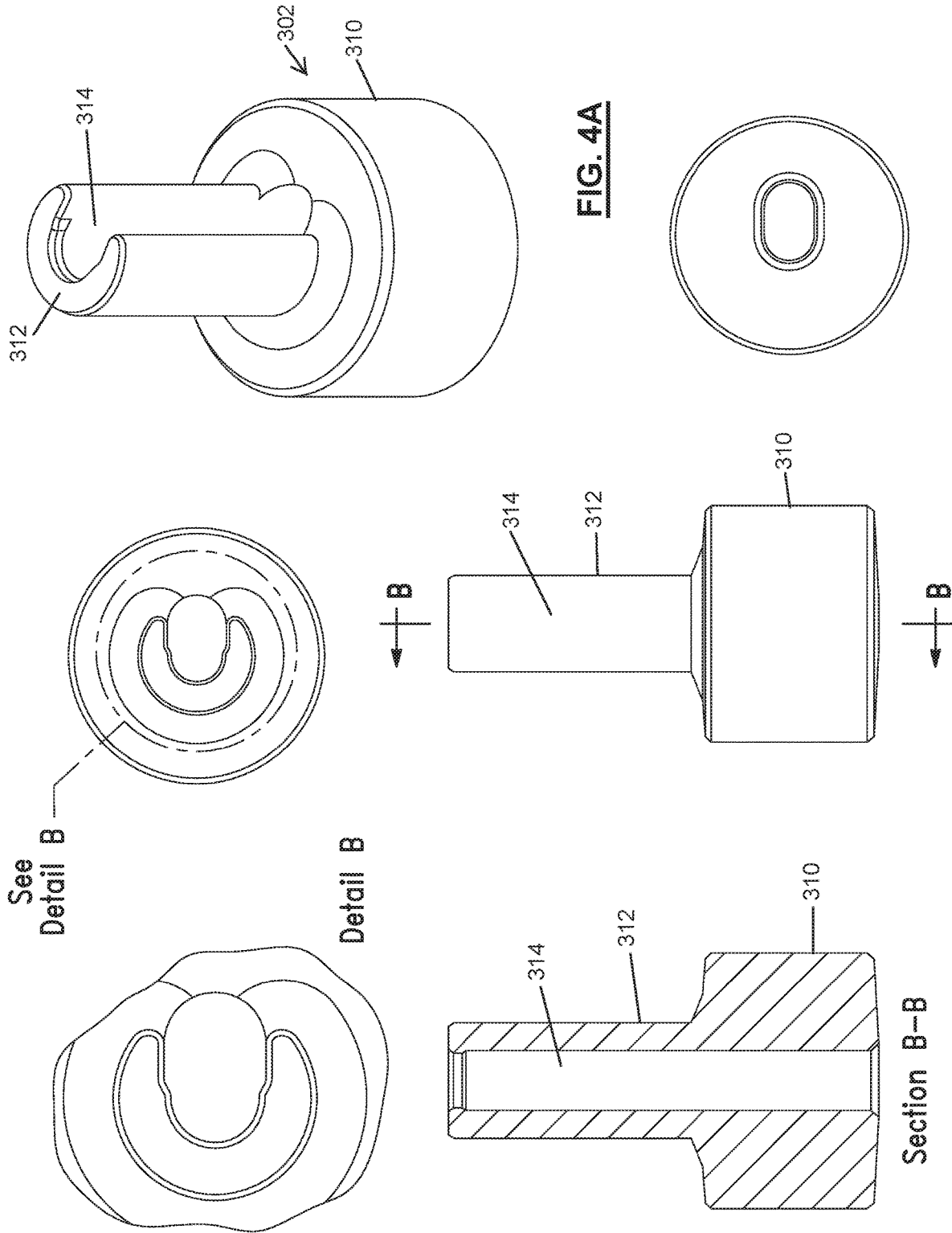

FIGS. 4A and 4B show a fork lock holder assembly 300. In FIGS. 4A and 4B, the fork lock holder assembly 300 comprises a base portion 302 and a top portion (also called a cap) 304. Before installing the top portion 304 on the base portion 302, the lift pin 130 is inserted through an opening 306 at the center of the top portion 304. The top portion 304 is installed on the base portion 302 by sliding down the top portion 304 along with the lift pin 130 into the base portion 302. The top portion 304 is then slid down on the lift pin 130 towards the base portion 302. The lift pin 130 gets locked into the base portion 302 as explained below and remains locked into the base portion 302.

After the top portion 304 is installed on the base portion 302, the fork lock holder assembly 300 looks externally similar to the ball lock holder assembly 200 shown in FIG. 3B. Therefore, a drawing of the fork lock holder assembly 300 with the top portion 304 installed on the base portion 302 is not shown again for brevity.

To remove the lift pin 130 from the fork lock holder assembly 300, the top portion 304 is pulled up and away from the base portion 302. When the top portion 304 is pulled up and away from the base portion 302, the lift pin 130 gets unlocked from the base portion 302 (i.e., from the fork lock holder assembly 300) and can be removed from the base portion 302.

FIG. 4A shows the base portion 302 of the fork lock holder assembly 300 in further detail. FIG. 4A shows various views of the base portion 302. While the base portion 302 is geometrically described below in terms of (i.e., as comprising) various elements, the base portion 302 is one piece (i.e., a single integrated structure).

The base portion 302 comprises a cylindrical portion 310 having a diameter b1. The cylindrical portion 310 defines a lower portion (or base) of the base portion 302. The base portion 302 comprises a slot 312 for receiving the lift pin 130. The slot 312 extends perpendicularly from the cylindrical portion 310 (i.e., along the height of the base portion 302, or the height of the fork lock holder assembly 300). The slot 312 is generally a C-shaped structure that defines a cavity 314 in which the lift pin 130 is received and retained. The slot 312 is generally a hollow, circular or oval shaped, tubular structure with a portion of the tubular structure sliced and removed along the length (i.e., the height) of the slot 312 to make the slot 312 a C-shaped structure. The cavity 314 extends through the slot 312 into the cylindrical portion 310. The height of the slot 312 is greater than the height of the cylindrical portion 310. A circle drawn around the slot 312 has a diameter b2 that is less than the diameter b1 of the cylindrical portion 310 of the base portion 302.

Detail B in FIG. 4A shows the design of the slot 312 that enables the lift pin 130 to be inserted and retained in the base portion 302 (i.e., in the fork lock holder assembly 300). The slot 312 has a series of radii so that the lift pin 130 can be inserted off-center from a centerline of the base portion 302 and then slid into the centerline. At a distal end (i.e., the end opposite from the cylindrical portion 310), the slot 312 includes a smaller (inner) radius or an inner radial portion that locks against the ring shaped groove 131 around the lift pin 130 (shown in FIG. 2). The inner radius or the inner radial portion of the slot 312 near the top end of the slot 312 engages with the ring shaped groove 131 on the lift pin 130 and locks the lift pin 130 into the slot 312 and in the base portion 302. A sliding surface of the slot 312 has a radius matching the insert portion of the slot 312 and is chamfered both above and below to guide the lift pin 130 to lock against the base portion 302. The outer radius of the slot 312 matches the inner radius of the top portion 304 so that the top portion 304 slides down the slot 312 and retains the lift pin 130 within the cavity 314 in the slot 312. Again, the elements 310-314 are integral to the base portion 302 and define the base portion 302 as a single piece.

FIG. 4B shows the top portion 304 of the fork lock holder assembly 300 in further detail. The top portion 304 is cylindrical in shape and comprises a hollow structure that mates with the slot 312 of the base portion 302. Again, while the top portion 304 is geometrically described below in terms of (i.e., as comprising) various elements, the top portion 304 is one piece (i.e., a single integrated structure).

The outer diameter of the top portion 304 may be less than the diameter b1 of the cylindrical portion 310. The height of the top portion 304 is less than the height of the slot 312 of the base portion 302.

The top portion 304 comprises the opening 306. The opening 306 has the diameter a1 that matches the diameter of the lift pin 130. The top portion 304 comprises a first cylindrical hollow portion 330 having the diameter a1 that extends from the opening 306 along the center (i.e., along the axis of the cylindrical shape or height) of the top portion 304. The top portion 304 further comprises a second cylindrical hollow portion 332 having a diameter p1 that extends from a distance y1 from the opening 306 along the center (i.e., along the axis of the cylindrical shape or height) of the top portion 304, where p1>a1, and p1=b2. The second cylindrical hollow portion 332 mates with and surrounds the slot 312 of the base portion 302 when the top portion 304 is installed on the base portion 302. The opening 306 aligns with a portion of the cavity 314 near the top of the slot 312 when the top portion 304 is installed on the base portion 302.

The first and second cylindrical hollow portions 330 and 332 of the top portion 304 define a single hollow portion or cavity in the top portion 304. The single hollow portion or cavity in the top portion 304 extends from the opening 306 at one (top) end of the top portion 304 to the other (bottom) end of the top portion 304.

FIGS. 5A-5C show a slotted ring (also called a lift ring) 400 that can be comprised in the base 114 of the substrate support assembly 16 shown in FIG. 2. In FIG. 5A, the slotted ring 400 comprises a plurality of coin slot type structures 402. The coin slot type structures 402 are designed to hold the lift pin holder assemblies shown in FIGS. 3A-4B and are hereinafter called slots 402. The number of slots 402 is equal to the number of lift pins 130 used with the substrate support assembly 16. FIG. 5B shows details for mounting the slotted ring 400 on the base 114 of the substrate support assembly 16 in Detail A. FIG. 5C shows the slot 402 in further detail.

The slotted ring 400 is annular and has an inner diameter and an outer diameter. Each slot 402 is defined by two parallel lines extending inward from the outer diameter of the slotted ring 400 for approximately half the distance (i.e., up to a midpoint) between the inner diameter and the outer diameter of the slotted ring 400. The distal ends (i.e., the inward extending ends) of the two parallel lines, which are opposite to the ends that terminate at the outer diameter of the slotted ring 400, bend inwards towards each other at an acute angle. Each slot 402 is further defined by an arc or C-shaped element with ends that terminate at the bent ends of the two parallel lines. A curved portion of the arc or C-shaped element extends towards the inner diameter of the slotted ring 400.

For each slot 402, a portion of the slotted ring 400 circumscribed by the two parallel lines, the arc or C-shaped element, and the portion of the outer diameter between the two parallel lines is removed (carved or dug out) from the slotted ring 400 to form the slot 402 having a uniform depth. For example, the slots 402 can be thus formed by machining or etching the circumscribed portion from the top surface of the slotted ring 400. The depth h of each slot 402 is less than the thickness of the slotted ring 400. The top of each slot 402 is flush with the top surface of the slotted ring 400. The slots 402 are coplanar with the slotted ring 400.

As explained below, retainers shown in FIGS. 6A and 6B, which can retain the lift pin holder assemblies shown in FIGS. 3A-4B, are slid into these slots 402 radially from the outer diameter to the inner diameter of the slotted ring 400.

In each slot 402, an aperture 404 is formed proximate to one of the two parallel lines and proximate to the outer diameter of the slotted ring 400. The aperture 404 is formed proximate to an intersection or corner of one of the two parallel lines and the outer diameter of the slotted ring 400.

As explained below, a T-shaped retainer shown in FIG. 7 can be inserted in the aperture 404 to prevent the retainers shown in FIGS. 6A and 6B from sliding radially outward (from the inner diameter to the outer diameter of the slotted ring 400) and out of the slot 402.

FIGS. 6A and 6B show retainers that can retain the lift pin holder assemblies shown in FIGS. 3A-4B when these assemblies along with the retainers are slid into the slots 402. FIG. 6A shows a retainer 500 for the ball lock holder assembly 200 shown in FIGS. 3A-3D. FIG. 6B shows a retainer 550 for the fork lock holder assembly 300 shown in FIGS. 4A and 4B.

In FIG. 6A, the retainer 500 for the ball lock holder assembly 200 is cylindrical in shape. FIG. 6A shows various views of the base portion retainer 500. While the retainer 500 is geometrically described below in terms of (i.e., as comprising) various elements, the retainer 500 is one piece (i.e., a single integrated structure).

The retainer 500 is defined by a hollow cylinder 502 of diameter c1 extending perpendicularly (i.e., along the height of the retainer 500) from an annular top surface 504. The annular top surface 504 is perpendicular to the hollow cylinder 502 (i.e., perpendicular to the height of the retainer 500) and includes a circular opening 506. The annular top surface 504 has an outer diameter c1 and an inner diameter c2, where c1>d1>c2. That is, the hollow cylinder 502 has an outer diameter c1>d1, and the circular opening 506 has a diameter c2<d1.

The retainer 500 includes an annular ring 508 at a distal end of the hollow cylinder 502. The annular ring 508 extends radially (i.e., perpendicularly to the height of the retainer 500) from the distal end of the hollow cylinder 502 that is opposite to the end extending from the annular top surface 504. The annular ring 508 has an inner diameter of c1 and an outer diameter that closely matches the distance between the two parallel lines that define each of the slots 402. The annular ring 508 has a thickness or height t that closely matches the depth h of the slots 402. Accordingly, the retainer 500 can radially slide into the slots 402. The annular ring 508 (and the retainer 500) has a circumference that mates with the arc or C-shaped element of the slot 402.

Again, the elements 502-508 are integral to the retainer 500 and define the retainer 500 as a single piece. The height of the retainer 500 (i.e., the height of the hollow cylinder 502) is greater than the height of the base portion 202 of the ball lock holder assembly 200. The height of the retainer 500 less than the height of the ball lock holder assembly 200.

Since c1>d1>c2, the retainer 500 can slide down from the top portion 204 of the ball lock holder assembly 200 after the top portion 204 is installed on the base portion 202 of the ball lock holder assembly 200 (i.e., after the ball lock holder assembly 200 is fully assembled). Further, since c1>d1>c2, the base portion 202 cannot be pulled out of the circular opening 506 by pulling on the top portion 204 that protrudes out of the circular opening 506 after the retainer 500 is slid down the ball lock holder assembly 200 and is slid into the slot 402. In the slot 402, the retainer 500 covers the base portion 202 of the ball lock holder assembly 200. The height of the retainer 500 is greater than the depth h of the slots 402 and the height of the base portion 202.

In FIG. 6B, the retainer 550 for the fork lock holder assembly 300 is also cylindrical in shape. FIG. 6B shows various views of the base portion retainer 550. While the retainer 550 is geometrically described below in terms of (i.e., as comprising) various elements, the retainer 550 is one piece (i.e., a single integrated structure).

The retainer 550 is defined by a hollow cylinder 552 of diameter q1 extending perpendicularly (i.e., along the height of the retainer 550) from an annular top surface 554. The annular top surface 554 is perpendicular to the hollow cylinder 552 (i.e., perpendicular to the height of the retainer 550) and includes a circular opening 556. The annular top surface 554 has an outer diameter q1 and an inner diameter q2, where q1>b1>q2. That is, the hollow cylinder 502 has an outer diameter q1>b1, and the circular opening 556 has a diameter q2<b1.

The retainer 550 includes an annular ring 558 at a distal end of the hollow cylinder 552. The annular ring 558 extends radially (i.e., perpendicularly to the height of the retainer 550) from the distal end of the hollow cylinder 552 that is opposite to the end extending from the annular top surface 554. The annular ring 558 has an inner diameter of q1 and an outer diameter that closely matches the distance between the two parallel lines that define each of the slots 402. The annular ring 558 has a thickness or height t that closely matches the depth h of the slots 402. Accordingly, the retainer 550 can radially slide into the slots 402. The annular ring 558 (and the retainer 550) has a circumference that mates with the arc or C-shaped element of the slot 402.

Again, the elements 552-558 are integral to the retainer 550 and define the retainer 550 as a single piece. The height of the retainer 550 (i.e., the height of the hollow cylinder 552) is greater than the height of the base portion 302 of the fork lock holder assembly 300. The height of the retainer 550 less than the height of the fork lock holder assembly 300.

Before positioning the fork lock holder assembly 300 in a slot 402 and before installing the top portion 304 on the base portion 302 of the fork lock holder assembly 300, the retainer 550 is placed over and to surround (i.e., cover) the base portion 302 since q1>b1. Then, before installing the top portion 304 on the base portion 302, the retainer 550 along with the base portion 302 is slid into a slot 402. Then the top portion 304, with the lift pin 130 inserted into the top portion 304, is installed on the base portion 302. Since the diameter b1 of the base portion 302 is greater that the diameter q2 of the circular opening 556, the base portion 302 cannot be pulled out of the circular opening 556 by pulling on the top portion 304 that protrudes out of the circular opening 556. In the slot 402, the retainer 550 covers the base portion 302 of the fork lock holder assembly 300. The height of the retainer 550 is greater than the depth h of the slots 402 and the height of the base portion 302.

When the retainer 500 along with the ball lock holder assembly 200 is in the slot 402, the annular top surface (which can also be called a circular portion) 504 of the retainer 500 is parallel to the top surface of the slotted ring 400. The stem portion 211 of the ball lock holder assembly 200 and the lift pin 130 retained therein extend through the circular opening 506 of the retainer 500 in a direction perpendicularly away from the top surface of the slotted ring 400. The cylindrical portion (i.e., the hollow cylinder 502) of the retainer 500 extends perpendicularly from the annular top surface (i.e., the circular portion) 504 of the retainer 500 towards the top surface of the slotted ring 400 and surrounds the cylindrical base portion 202 of the ball lock holder assembly 200.

When the retainer 550 along with the fork lock holder assembly 300 is in the slot 402, the annular top surface (which can also be called a circular portion) 554 of the retainer 550 is parallel to the top surface of the slotted ring 400. The slot 312 (which can also be called a stem portion) of the fork lock holder assembly 300 and the lift pin 130 retained therein extend through the circular opening 556 of the retainer 550 in a direction perpendicularly away from the top surface of the slotted ring 400. The cylindrical portion (i.e., the hollow cylinder 552) of the retainer 550 extends perpendicularly from the annular top surface (i.e., the circular portion) 554 of the retainer 550 towards the top surface of the slotted ring 400 and surrounds the cylindrical portion 310 of the fork lock holder assembly 300.

FIG. 7 shows a T-shaped retainer 600 that can be inserted in the aperture 404 after the retainers 500, 550 shown in FIGS. 6A and 6B are slid into the slots 402 along with respective lift pin holder assemblies 200, 300. The T-shaped retainer 600 is a single piece that includes a top portion 602 and a bottom portion 604. The top portion may be rectangular while the bottom portion may be cylindrical. The bottom portion 604 extends perpendicularly from the top portion 602. The bottom portion 604 is inserted into the aperture 404. Then the T-shaped retainer 600 is rotated such that the top portion 602 prevents the retainers 500, 550 from sliding radially outward (from the inner diameter to the outer diameter of the slotted ring 400) and out of the slot 402. The height of the T-shaped retainer 600 is less than the height of each of the retainer 500 and the retainer 550.

When the T-shaped retainer 600 is mounted on the slotted ring (i.e., inserted into the aperture 404), the bottom portion 604 is perpendicular to a plane in which the slotted ring 400 lies, and the top portion 602 is parallel to the plane in which the slotted ring 400 lies. The top portion 602 extends into a radially outward path of the retainers 500, 550. By thus obstructing the radially outward path of the retainers 500, 550, the T-shaped retainers 600 secure the retainers 500, 550 along with their respective pin holder assemblies 200, 300 in the slots 402. Stated differently, the T-shaped retainers 600 prevent the retainers 500, 550 and their respective pin holder assemblies 200, 300 from sliding out of the slots 402.

When mounted on the slotted ring (i.e., inserted into the slots 402), the heights of the elements 200, 300, 500, and 550 are parallel to an axis that is perpendicular to the plane in which the slotted ring 400 lies. The plane in which the slotted ring 400 lies parallel to the plane in which the substrate lies on the substrate support assembly during processing.

Throughout the present disclosure, the shapes of elements 130 and 200-604 are described as being generally circular and cylindrical. However, at least some of these elements can have other shapes.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer.

In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A lift pin holder assembly comprising:

a base portion including a cavity at a center of the base portion, the cavity extending along a height of the base portion and configured to receive a lift pin;

a stem portion extending perpendicularly from the base portion along the height of the base portion, the cavity extending through a center of the stem portion along a height of the stem portion, the centers of the base and stem portions being collinear, and the stem portion including a ball lock arranged at a distal end of the stem portion and proximate to a portion of the cavity that is adjacent to the distal end of the stem portion, wherein the ball lock is configured to lock the lift pin in the stem portion; and a top portion surrounding and retained around the stem portion and including an opening adjacent to the distal end of the stem portion coincident with the cavity.

2. The lift pin holder assembly of claim 1 wherein the base, stem, and top portions are made of a ceramic material.

3. The lift pin holder assembly of claim 1 further comprising a lift pin having a first end inserted into the cavity in the stem portion trough the opening in the top portion, the first end including a circular groove, the lift pin retained in the cavity in the stem portion by the ball lock locked into the circular groove, and the lift pin having a second end extending out of the opening of the top portion along the height of the stem portion.

4. The lift pin holder assembly of claim 1 wherein the base portion is cylindrical and has a first diameter, and wherein the stem portion comprises:

a first cylindrical portion extending perpendicularly from the base portion along the height of the stem portion and having a second diameter that is less than the first diameter;

a second cylindrical portion extending perpendicularly from the first cylindrical portion along the height of the stem portion and having a third diameter that is greater than the second diameter and less than the first diameter; and a ring shaped structure surrounding the second cylindrical portion.

5. The lift pin holder assembly of claim 4 wherein:

the second cylindrical portion includes a slot for the ball lock; and the slot is located on an opposite side of the ring shaped structure relative to the first cylindrical portion.

6. The lift pin holder assembly of claim 4 wherein the ring shaped structure is located around a middle portion of the second cylindrical portion.

7. The lift pin holder assembly of claim 4 wherein the top portion comprises:

a circular portion including the opening at a center of the circular portion; and a hollow cylindrical portion extending perpendicularly from the circular portion along the height of the stem portion and mating with the second cylindrical portion and the ring shaped structure surrounding the second cylindrical portion.

8. The lift pin holder assembly of claim 1 wherein:

the base portion has a first height; and the stem portion has a second height that is greater than the first height.

9. The lift pin holder assembly of claim 8 wherein:

the base portion is cylindrical and has a first diameter; and the top portion is cylindrical, has a second diameter that is less than or equal to the first diameter, and has a third height that is less than the second height and greater than the first height.

10. The lift pin holder assembly of claim 1 wherein:

the cavity is cylindrical and has a first diameter;

the opening is circular and has a second diameter that is substantially equal to the first diameter; and the cavity and the opening are aligned along the height of the stem portion.

11. The lift pin holder assembly of claim 3 wherein:

the cavity is cylindrical and has a first diameter;

the opening is circular and has a second diameter;

the cavity and the opening are aligned along the height of the stem portion; and the lift pin is cylindrical and has a third diameter than is less than the first and second diameters.

12. The lift pin holder assembly of claim 1, wherein the top portion locks the lift pin to the stem portion when moved toward the base portion.

* * * * *